United States Patent [19]

Ohshima et al.

[11] Patent Number: 4,606,171

[45] Date of Patent: Aug. 19, 1986

[54] TAPING PACKAGE METHOD FOR SMALL-SIZE ELECTRONIC PARTS

[76] Inventors: Kazuo Ohshima, c/o Okuitoku Co., Ltd., 11-11, 4-chome, Tenma, Kita-ku, Osaka City, Osaka Prefecture; Tomio Jinzaki, 8-17, 4-chome, Nishi-Tenma, Kita-ku, Osaka City, Osaka Prefecture, both of Japan

[21] Appl. No.: 648,687

[22] Filed: Sep. 10, 1984

[30] Foreign Application Priority Data

Feb. 23, 1984 [JP] Japan ................... 59-33840

[51] Int. Cl.⁴ ............................................. B65B 15/04
[52] U.S. Cl. ...................................... 53/397; 53/430; 53/594
[58] Field of Search ................... 29/432; 53/118, 397, 53/399, 430, 591, 594; 206/328, 331; 221/70

[56] References Cited

U.S. PATENT DOCUMENTS

| 3,420,365 | 1/1969 | Bailey | 53/430 X |
| 4,171,049 | 10/1979 | Nohara et al. | 206/328 |
| 4,231,901 | 11/1980 | Berbeco | 206/331 X |

FOREIGN PATENT DOCUMENTS

| 961454 | 1/1975 | Canada | 221/70 |
| 3135076 | 3/1982 | Fed. Rep. of Germany | 206/328 |
| 1278785 | 6/1972 | United Kingdom | 53/430 |

Primary Examiner—James M. Meister
Assistant Examiner—Michael D. Folkerts
Attorney, Agent, or Firm—Sidney W. Millard

[57] ABSTRACT

Small-size electronic parts having leads are packaged with a carrier tape composed of a tape base having tape feed holes and a tape body of formed plastic attached to the tape base. The carrier tape is unreeled from a supply reel, and the leads of the electronic parts are caused to pierce the tape body. The carrier tape with the electronic parts retained on the tape body is wound around a takeup reel.

1 Claim, 3 Drawing Figures

TAPING PACKAGE METHOD FOR SMALL-SIZE ELECTRONIC PARTS

BACKGROUND OF THE INVENTION

1. Field of the Invention

The present invention relates to a method for packaging, with a tape, various on-chip electronic parts having leads such as resistors, capacitors, coils, semiconductors and the like for use in electronic devices.

2. Description of the Prior Art

As electronic devices have become smaller in size and higher in performance in recent years, more and more electronic parts are fabricated on chips. There are growing demands for packaging such on-chip electronic parts on a mass-production basis on an elongated tape with an automatic inserting machine.

There are several known methods for packaging, with a tape, on-chip electronic parts such as resistors, capacitors, coils semiconductors, and the like. Such methods include use of a paper tape with punched rectangular holes and circular feed holes or a plastic tape molded with rectangular recesses and circular feed holes. FIG. 1 of the accompanying drawings illustrates the prior art comprising a taping method employing a paper tape with punched rectangular holes and circular feed holes. The illustrated prior art is disclosed in commonly owned and still pending U.S. patent application Ser. No. 518,544 filed on July 29, 1983 or German Patent Application No. P3327612.9 filed on July 30, 1983. FIG. 1 shows a composite tape (generally called a "carrier tape") 1 composed of a tape base 1-2 having parts-housing rectangular holes 1-3 and circular feed holes 1-4, both punched therein, and a cover tape 1-5 attached to the tape base 1-2. In operation, the composite tape 1 is unreeled from a taping reel 2-1, on-chip parts are inserted into the rectangular holes 1-3, a cover tape 1-6 is attached to the tape 1 in covering relation to the parts, and the resultant tape is wound around a taping reel 2-2.

The known packaging methods are however limited to only on-chip electronic parts such as resistors, capacitors, transistors, and the like, but are not effective in packaging electronic parts having long leads, such as IC (Integrated circuits) switches or semifixed rheostats. The electronic parts with long leads could be packaged with tapes by increasing the width and thickness of the tape and enlarging parts-housing holes, or using carrier tapes designed for exclusive use with respective types of electronic parts. Such methods however would be costly. Since the current trend in the electronic industry is toward the use of more and more electronic parts with long leads, there has been a strong demand in the industry for a method capable of economically packaging such electronic parts with a tape.

SUMMARY OF THE INVENTION

It is an object of the present invention to provide a packaging method capable of efficiently and economically packaging, with a tape, small-size electronic parts having long leads.

According to the present invention, a tape body of electrically conductive or nonconductive foamed plastic is attached to one surface of a tape base having circular tape feed holes. Small-size electronic parts are successively placed on the tape body with their leads piercing the tape body, and the resultant tape-packaged parts are wound on a takeup reel.

The tape body of the invention is therefore devoid of any parts-insertion holes. The electronic parts are retained on the tape body simply by having their leads pierce the tape body. With the method of the invention, it is not necessary to punch parts housing holes in the tape body, and those electronic parts having long leads can all be mounted securely on the tape body irrespectively of the sizes of the parts.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

Figure 1:
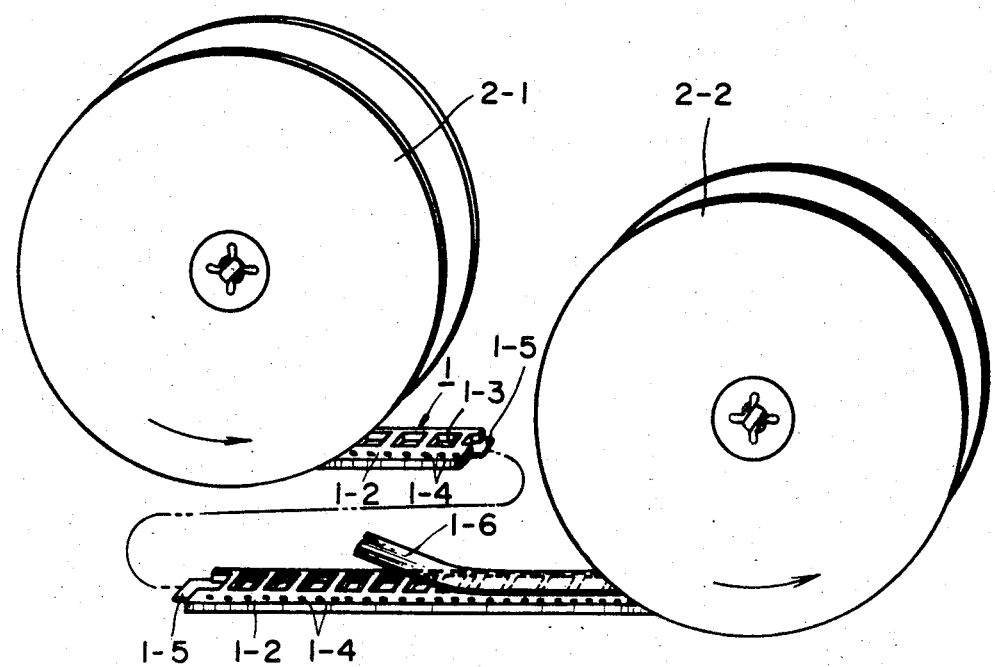
FIG. 1 is a perspective view showing a conventional packaging system for electronic parts.
Figure 2:
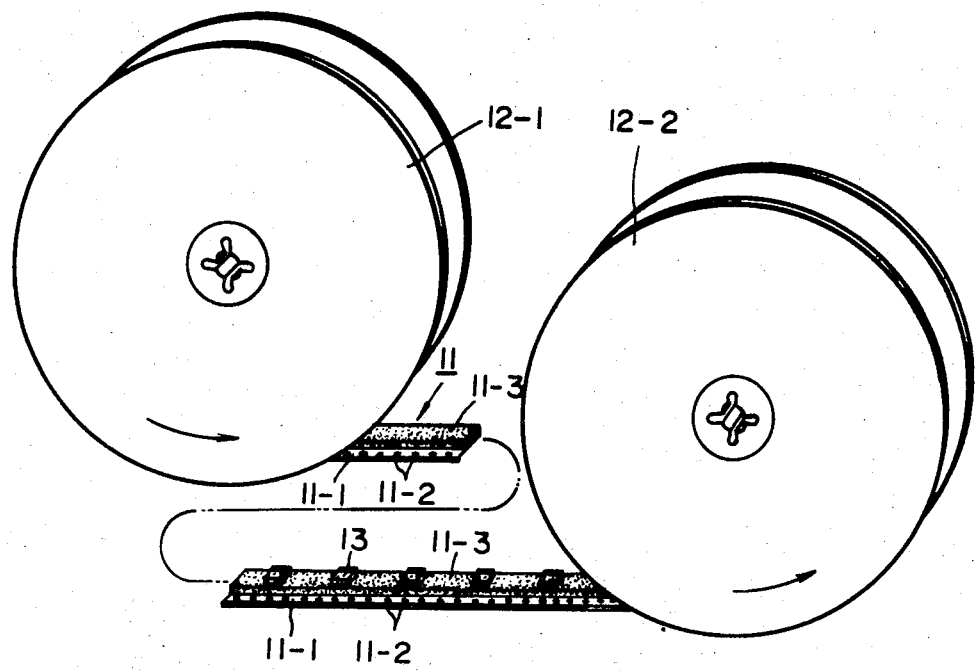
FIG. 2 is a perspective view showing a carrier tape used in a packaging method according to the present invention.
Figure 3:
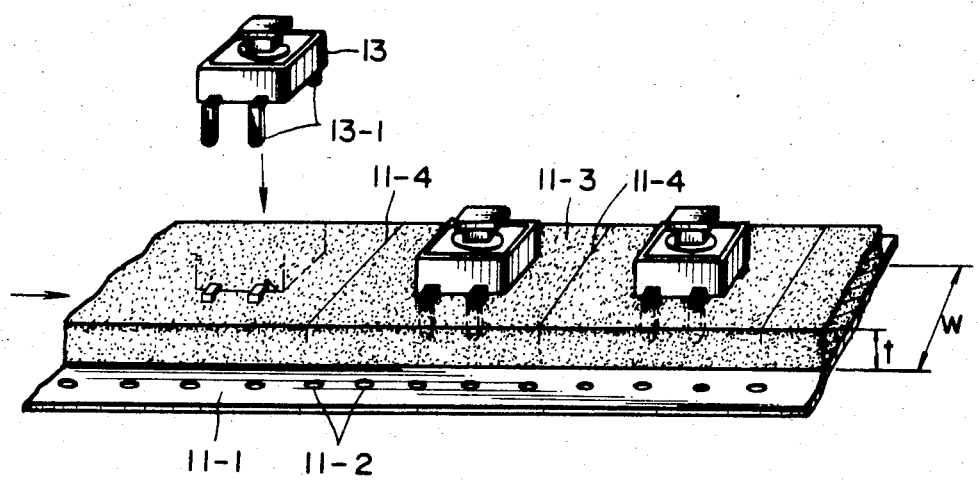
FIG. 3 is a fragmentary enlarged perspective view illustrative of the manner in which electronic parts are successively mounted on the carrier tape of FIG. 2.

As shown in FIGS. 2 and 3, a carrier tape 11 is composed of a tape base 11-1 having circular tape feed holes 11-2 punched in rows along opposite longitudinal edges and an elongate continuous tape body 11-3 of foamed plastic attached to one side of the tape base 11-1 for supporting electronic parts thereon. The tape body 11-3 has a width W and a thickness t which are selected to meet the size of electronic parts 13 to be mounted and the length of lead wires 13-1 of the electronic parts 13 so that the electronic parts will not cover the feed holes 11-2 or will not extend beyond the tape width. The uniform thickness t provides a surface remote from tape base 11-1 which is substantially coplanar with the tape base and is best illustrated in FIG. 3.

The tape body 11-3 of foamed plastic should preferably be electrically conductive since some electronic parts to be packaged are susceptible to damage due to an electrostatic charge. The tape body 11-3 may be rendered electrically conductive by mixing carbon, for example, into the foamed plastic.

The tape base 11-1 may be of any desired material. However, since the tape base 11-1 should not elongate or contract under various environmental conditions such as temperature or tension to ensure accurate positions for mounting and picking up electronic parts, the tape base should preferably be of paper which is made nonstretchable and noncontractable by being coated with silicone.

Packaging small-size electronic parts having long leads with the above carrier tape 11 will now be described. The carrier tape 11 wound around a taping reel 12-1 is continuously unreeled by a suitable mechanical device (not shown). Leads 13-1 of a small-size electronic part 13 are held in confronting relation to the tape body 11-3 by a mounting device (not shown) having a presser mechanism, and then are pushed against the surface of the tape body 11-3 so that the tape body 11-3 is pierced with the leads 13-1 (FIG. 3). The carrier tape 11 with the small-size electronic devices 13 retained thereon is then wound on another taping reel 12-2. To allow the carrier tape 11 to be wound easily, it should preferably be provided with slits 11-4 at suitable longitudinal intervals. When removing the small-size electronic parts 13 from the carrier tape 11 wound on the taping reel 12-2, the carrier tape 11 is unreeled from the reel 12-2 by a mechanical device (not shown), and the electronic parts 13 are lifted off the tape body 11-3 by a suitable means such as an air suction device.

With the method of the invention, the small-size electronic parts are retained in place on the carrier tape with their leads piercing the tape body, and will not be dislodged from the wounded carrier tape even under vibrations or impacts applied. Since the tape body of foamed plastic is resilient, and is deposited on the tape base, the carrier tape can dampen applied vibrations and shocks so that the packaged electronic parts can be protected against undesirable vibrations and shocks during shipment. The tape body in the form of an elongate web can be pierced by short and long leads of electronic parts regardless of the size of the electronic parts. Accordingly, it is not necessary to provide as many different carrier tapes as there are different types of electronic parts to be packaged.

The method of the invention is therefore of great advantage in the field of manufacturing electronic parts and devices since small electronic parts having long leads can easily be packaged with tapes.

Although a certain preferred embodiment has been shown and described, it should be understood that many changes and modifications may be made therein without departing from the scope of the appended claims.

What is claimed is:

1. A method for packaging small-sized electronic parts having leads with a carrier tape, said tape including a tape base having tape feed holes and a electrically conductive body of carbon and foamed plastic attached to the tape base, comprising the steps of:
    (a) providing a surface on the body remote from and substantially co-planar with the tape;
    (b) causing the leads of the electronic parts to pierce and deform the tape body and the tape body to grip the leads to hold the electronic parts in place on said surface;
    (c) winding the carrier tape with the electronic parts retained on the tape body around a reel;
    (d) slitting said tape body transversely at spaced longitudinal intervals prior to winding on the reel; and
    (e) coating said carrier tape with silicone prior to winding on the reel, thereby rendering said carrier tape nonstretchable and non-contractable.

* * * * *